(12) United States Patent
Kim et al.

(10) Patent No.: US 8,373,178 B2
(45) Date of Patent: Feb. 12, 2013

(54) LIGHT EMITTING DEVICE, LIGHT EMITTING DEVICE PACKAGE AND LIGHTING SYSTEM HAVING THE SAME

(75) Inventors: Sung Kyoon Kim, Seoul (KR); Woo Sik Lim, Seoul (KR); Myeong Soo Kim, Seoul (KR); Sung Ho Choo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/025,662

(22) Filed: Feb. 11, 2011

(65) Prior Publication Data

US 2011/0198563 A1    Aug. 18, 2011

(30) Foreign Application Priority Data

Feb. 12, 2010 (KR) .................. 10-2010-0013539

(51) Int. Cl.
*H01L 27/15* (2006.01)
(52) U.S. Cl. ........................... 257/79; 257/13
(58) Field of Classification Search .............. 257/13, 257/79
See application file for complete search history.

(56) References Cited

U.S. PATENT DOCUMENTS

| 6,417,525 B1 | 7/2002 | Hata | |
| 7,868,351 B2 * | 1/2011 | Taniguchi et al. | 257/103 |
| 7,893,449 B2 * | 2/2011 | Fukunaga et al. | 257/98 |
| 7,947,999 B2 * | 5/2011 | Tomioka et al. | 257/99 |
| 2003/0062530 A1 * | 4/2003 | Okazaki et al. | 257/79 |
| 2006/0267034 A1 | 11/2006 | Orita | |
| 2007/0178689 A1 | 8/2007 | Nakamura et al. | |
| 2009/0090922 A1 | 4/2009 | Fukunaga et al. | |
| 2009/0173962 A1 * | 7/2009 | Hanawa et al. | 257/99 |
| 2010/0213485 A1 * | 8/2010 | McKenzie et al. | 257/98 |
| 2010/0295080 A1 * | 11/2010 | Lim | 257/98 |

FOREIGN PATENT DOCUMENTS

| JP | 2006-100474 A | 4/2006 |
| KR | 2000-0076416 A | 12/2000 |
| KR | 10-2004-0090465 A | 10/2004 |
| KR | 10-2008-0108559 A | 12/2008 |
| WO | WO 2004/112157 A1 | 12/2004 |

* cited by examiner

*Primary Examiner* — David Vu
*Assistant Examiner* — Brandon Fox
(74) *Attorney, Agent, or Firm* — Birch, Stewart, Kolasch & Birch, LLP

(57) ABSTRACT

A light emitting device includes a light emitting structure including a first conductive type semiconductor layer, an active layer on the first conductive type semiconductor layer, and a second conductive type semiconductor layer on the active layer; and a transparent electrode layer formed at least one of on and under the light emitting structure, wherein the transparent electrode layer has a thickness in a range of 30 nm to 70 nm to obtain a transmittance equal to or greater than 70% with respect to a wavelength range of light of 420 nm to 510 nm.

19 Claims, 15 Drawing Sheets

LIGHT EMITTING DEVICE, LIGHT EMITTING DEVICE PACKAGE AND LIGHTING SYSTEM HAVING THE SAME

CROSS-REFERENCE TO RELATED APPLICATION

This application claims priority under 35 U.S.C. §119 of Korean Patent Application No. 10-2010-0013539 filed in the Korean Intellectual Property Office on Feb. 12, 2010, which is hereby incorporated by reference in its entirety.

BACKGROUND OF THE INVENTION

1. Field of the Invention

Embodiments of the invention relate to a light emitting device, a light emitting device package, and a lighting system using the same.

2. Discussion of the Related Art

Group III-V nitride semiconductors are getting the spotlight as core materials of light emitting devices such as a light emitting diode (LED), a laser diode (LD), etc. due to their physical and chemical properties. An example of a Group III-V nitride semiconductor is a semiconductor material having a compositional formula of $In_xAl_yGa_{1-x-y}N$ ($0 \leq x \leq 1$, $0 \leq y \leq 1$, $0 \leq x+y \leq 1$).

A light emitting diode (LED) is one type of semiconductor devices which converts electricity to light using the characteristics of a semiconductor, or is used as a light source.

LEDs or LDs using such a nitride semiconductor material are mainly used in light emitting devices for obtaining light, or are being applied as light sources for various devices such as a key pad light emitting part of a mobile phone, an electronic signboard, a lighting apparatus, a display apparatus, and the like.

SUMMARY OF THE INVENTION

Embodiments provide a light emitting device that can improve transmittance of a transparent electrode layer, a light emitting device package, and a lighting system using the same.

Embodiments provide a light emitting device that can improve light extraction efficiency by adjusting the thickness of a transparent electrode layer, a light emitting device package, and a lighting system using the same.

An embodiment provides a light emitting device including a light emitting structure including a first conductive type semiconductor layer, an active layer on the first conductive type semiconductor layer, and a second conductive type semiconductor layer on the active layer; and a transparent electrode layer formed at least one of on and under the light emitting structure, wherein the transparent electrode layer has a thickness in a range of 30 nm to 70 nm to obtain a transmittance equal to or greater than 70% with respect to a wavelength range of light of 420 nm to 510 nm.

An embodiment provides a light emitting device including a light emitting structure including a first conductive type semiconductor layer, an active layer on the first conductive type semiconductor layer, and a second conductive type semiconductor layer on the active layer; and a transparent electrode layer formed at least one of on and under the light emitting structure, wherein the transparent electrode layer has a thickness of in a range of 150 nm to 190 nm.

DETAILED DESCRIPTION OF THE EMBODIMENTS

Figure 1:
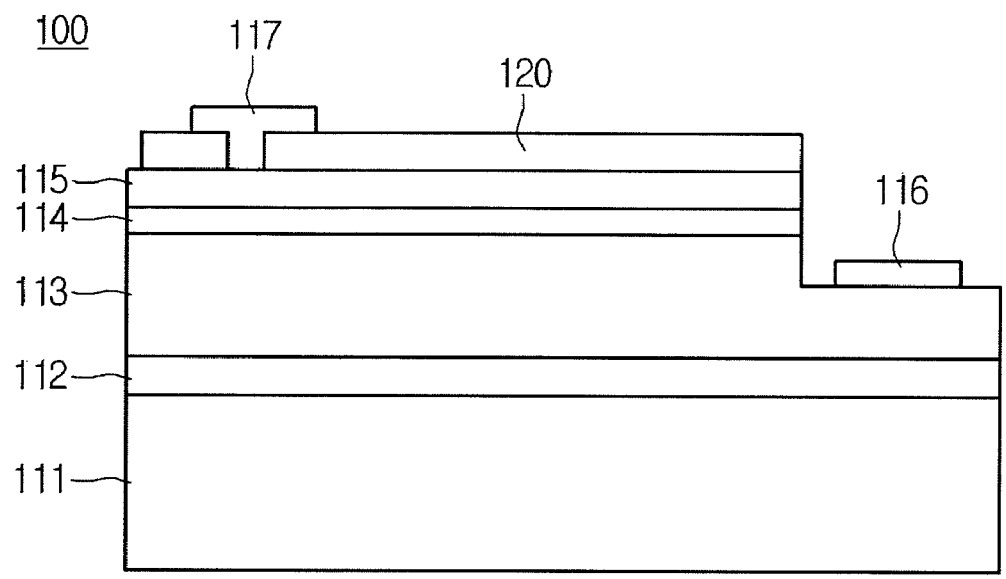
FIG. 1 is a side sectional view of a light emitting device according to an embodiment.

In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'. Further, the reference about 'on' and 'under' each layer will be made on the basis of drawings.

The embodiments will now be described more fully with reference to the accompanying drawings, in which example embodiments of the present invention are shown. In the drawings, the thickness or size of each layer is exaggerated, omitted, or schematically illustrated for convenience in description and clarity. Also, the size of each element does not entirely reflect an actual size.

FIG. 1 is a side sectional view of a light emitting device according to an embodiment.

Referring to FIG. 1, the light emitting device 100 includes a substrate 111, a semiconductor layer 112, a first conductive type semiconductor layer 113, an active layer 114, a second conductive type semiconductor layer 115, a transparent electrode layer 120, a first electrode 116, and a second electrode 117.

The light emitting device 100 may include a light emitting diode (LED) using a compound semiconductor layer including plural semiconductor elements, for example, using a Group III-V compound semiconductor layer, and the Group III-V compound semiconductor may include semiconductor material having a compositional formula of $In_xAl_yGa_{1-x-y}N$ ($0 \leqq x \leqq 1, 0 \leqq x \leqq 1, 0 \leqq x+y \leqq 1$). The LED may be a color LED emitting color light such as blue light, green light or red light, or a UV (Ultraviolet) LED. The light emitted from the LED may be implemented by using various semiconductors within the technical scope of the embodiment.

The substrate 111 may be an insulating or conductive growth substrate from which the group III-V compound semiconductor may be grown. The substrate 111 may be selected from the group consisting of sapphire ($Al_2O_3$), GaN, SiC, ZnO, Si, GaP, InP, $Ga_2O_3$, and GaAs substrates. Hereinafter, an embodiment using an example of an insulating substrate such as a sapphire ($Al_2O_3$) substrate will be described.

An uneven pattern or a light extraction structure may be formed in a lens shape, a pillar shape or a pyramid shape on the substrate 111. The substrate 111 may have a thickness ranging from about 100 μm to about 400 μm, which may be varied with the lapping or/and polishing of a lower surface of the substrate 111.

The semiconductor layer 112 (as buffer layer, for example) may be formed on the substrate ill. The semiconductor layer 112 may be formed in a layer or pattern using compound semiconductors using species (or combinations) of Group II element to Group VI elements so that doping materials may come from group II through group VI materials, for example, ZnO, GaN, AlN, AlGaN, InGaN, InN, InAlGaN, AlInN, AlGaAs, GaP, GaAs, GaAsP, AlGaInP, or the like. The semiconductor layer 112 may be, for example, formed as a buffer layer or undoped layer. Where the semiconductor layer 112 is formed as the buffer layer, the semiconductor layer 112 allows a difference in the lattice constant between the substrate 111 and an overlying layer to be decreased. The undoped semiconductor layer may be, for example, formed of undoped GaN-based semiconductor on the buffer or the substrate. The semiconductor layer 112 need not be formed, but for convenience of description, the structure including the semiconductor layer 112 will be described.

The first conductive type semiconductor layer 113 may be formed on the semiconductor layer 112, the active layer 114 may be formed on the first conductive type semiconductor layer 113, and the second conductive type semiconductor layer 115 may be formed on the active layer 114. Alternatively, an intervening layer may be disposed on or under each of the layers, but the embodiments of the present invention are not limited thereto.

The first conductive type semiconductor layer 113 may be selected from Group III-V compound semiconductors doped with a first conductive type dopant. For example, the first conductive type semiconductor layer 113 may be selected from semiconductor materials having a compositional formula of $In_xAl_yGa_{1-x-y}N$ ($0 \leqq x \leqq 1, 0 \leqq x \leqq 1, 0 \leqq x+y \leqq 1$), for example, from the group consisting of AlGaAs, GaP, GaAs, GaAsP, and AlGaInP. In the instance where the first conductive type semiconductor layer 113 is an N-type semiconductor layer, the first conductive type dopant is an N-type dopant, such as Si, Ge, Sn, Se, Te, or the like. The first conductive type semiconductor layer 113 may be formed in a single layer or multi-layer, but the present invention is not limited thereto. Also, the first conductive type semiconductor layer 113 may be formed with an area which is equal to or different from that of the active layer 114, but the present invention is not limited thereto.

The active layer 114 may be formed on the first conductive type semiconductor layer 113 as a single quantum well structure, or a multi quantum well (MQW) structure. The active layer 114 may be formed even as a quantum-wire structure, or a quantum dot structure. The active layer 114 may be formed as a periodic repeating of well layer/barrier layers using a pair of compound semiconductor materials composed of Group III element and Group V element. For example, the active layer 114 may include at least one of a period of InGaN well layer/GaN barrier layer, a period of InGaN well layer/AlGaN barrier layer, or a period of InGaN well layer/InGaN barrier layer. The band gap of the barrier layer may be higher than that of the well layer.

A conductive clad layer may be formed on and/or under the active layer 114. The conductive clad layer may be formed of GaN-based semiconductor, or a material having a band gap that is higher than that of the active layer 114.

The second conductive type semiconductor layer 115 is formed on the active layer 114. The second conductive type semiconductor layer 115 may include a group III-V compound semiconductor doped with a second conductive type dopant. For example, the second conductive type semiconductor layer 115 may be selected from semiconductor materials having a compositional formula of $In_xAl_yGa_{1-x-y}N$ ($0 \leqq x \leqq 1, 0 \leqq x \leqq 1, 0 \leqq x+y \leqq 1$), for example, from AlGaAs, GaP, GaAs, GaAsP, AlGaInP, and the like. In the instance where the second conductive type semiconductor layer 115 is a P-type semiconductor layer, the second conductive type dopant may include a P-type dopant such as Mg, Zn, Ca, Sr, Ba, or the like. The second conductive type semiconductor layer 115 may be formed in a single layer or multi-layer, but the present invention is not limited thereto.

Also, a third conductive type semiconductor layer, which, for example, having an opposite polarity to that of the second conductive type, may be formed on the second conductive type semiconductor layer 115. Therefore, the light emitting device 100 may be formed with at least one of N-P junction structure, P-N junction structure, N-P-N junction structure, or P-N-P junction structure. In the embodiment discussed below, a structure where the second conductive type semiconductor layer 115 is disposed at an upper portion of the light emitting device will be described as one example. A roughness or pattern may be formed at an upper surface of the light emitting device, for example at an upper surface of the second conductive type semiconductor layer 115.

The transparent electrode layer 120 is formed on the second conductive type semiconductor layer 115. The transparent electrode layer 120 may be formed on at least 50% or more area of the upper surface of the second conductive type semiconductor layer 115, but the present invention is not limited thereto. Also, in the instance where the substrate 111 and the semiconductor layer 112 are removed from the light emitting device, the transparent electrode layer 120 may be formed on at least 50% or more of an area of a lower surface of the first conductive type semiconductor layer 113, but the present invention is not limited thereto. In embodiments, the transparent electrode layer 120 may be formed at least one of on the first conductive type semiconductor layer 113 or under the second conductive type semiconductor layer 115, but for convenience of description, an example where the transparent electrode layer 120 is disposed on the second conductive type semiconductor layer 115 will be described. In the instance where a roughness or pattern is formed at the upper surface of the second conductive type semiconductor layer 115, the transparent electrode layer 120 may be formed with an irregular surface.

The transparent electrode layer 120 may function as a current diffusing layer for diffusing current inputted to the semiconductor layer, and may include a transparent material, transmissive material and conductive material. The transparent electrode layer 120 may include a transparent metal oxide or a transparent metal nitride, and may be formed of a material selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), ITO Nitride (ITON), and IZO Nitride (IZON). In the embodiment, an example using an ITO layer as the transparent electrode layer will be described. Another material layer, for example, a metal layer or an insulating layer may be disposed on or under the transparent electrode layer 120, but the present invention is not limited thereto.

The transparent electrode layer 120 may have a thickness ranging from about 30 nm to 70 nm, and a refractive index ranging from about 1.7 to 2.1. The transparent electrode layer 120 has about an 80% or more transmittance with respect to a predetermined wavelength, for example, with respect to a wavelength ranging from 430 nm to 500 nm, and has about a 5% to 10% reflectivity with respect to a predetermined wavelength, for example, with respect to a wavelength ranging from about 430 nm to 500 nm. The light emitted from the active layer 114 may have a wavelength ranging from about 430 nm to 500 nm. Also, the transparent electrode layer 120 may have a thickness ranging from about 150 nm to 190 nm, and when the transparent electrode layer 120 has a thickness ranging from about 150 nm to 190 nm, the transparent electrode layer 120 has about an 80% or more transmittance with respect to the wavelength ranging from about 435 nm to 500 nm. The wavelength may be a wavelength of the light emitted from the active layer 114 or a wavelength of another light.

The transmittance of the transparent electrode layer 120 can improve the light extraction efficiency of the light emitting device 100. The transparent electrode layer 120 may be formed by an equipment selectively using sputtering, e-beam, or MOCVD technique.

The second electrode 117 is formed on the transparent electrode layer 120. The second electrode 117 is disposed on a portion of the transparent electrode layer 120 and may be connected to at least one of the transparent electrode layer 120 and the second conductive type semiconductor layer 115.

The second electrode 117 may include at least one pad. The second electrode 117 may be formed in a single layer or multi-layer using one or more material or alloy selected from the group consisting of Ti, Al, Al alloy, In, Ta, Pd, Co, Ni, Si, Ge, Ag, Ag alloy, Au, Hf, Pt, Ru, and Au. While the embodiment, as an example, shows and describes the second electrode 117 being disposed on the transparent electrode layer 120, the light emitting device may be implemented in such a manner that the second electrode 117 may be disposed on a predetermined position of a chip and may be electrically connected to the transparent electrode layer 120 and/or the second conductive type semiconductor layer 115. A portion of the second electrode 117 has a line shape and may be disposed on the second conductive type semiconductor layer 115 or/and the transparent electrode layer 120.

The first electrode 116 is formed on the first conductive type semiconductor layer 113 to supply current to the first conductive type semiconductor layer 113. The first electrode 116 may be formed of a metallic material including one or more elements selected from the group consisting of Cu, Ti, Cr, Ta, Al, In, Pd, Co, Ni, Ge, Ag, and Au, but the present invention is not limited. While this embodiment shows and describes the first electrode 116 being formed on the first conductive type semiconductor layer 113, the first electrode 116 may be implemented by an electrode pattern which is formed on one of a top, bottom and a side surface of the first conductive type semiconductor layer 113, and electrically connected thereto, but the present invention is not limited thereto.

Figure 2:
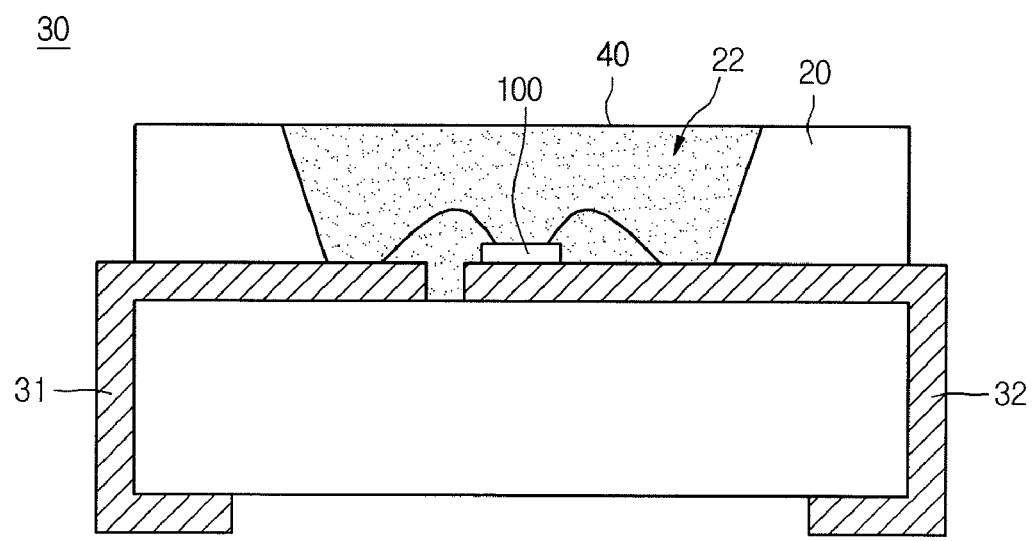
FIG. 2 is a schematic sectional view of a light emitting device package using the light emitting device shown in FIG. 1.

FIG. 2 is a schematic sectional view of a light emitting device package obtained by packaging the light emitting device of FIG. 1.

Referring to FIG. 2, the light emitting device package 30 includes a body 20, first lead electrode 31 and second lead electrode 32 mounted in the body 20, a light emitting device 100 according to the embodiment mounted in the body 20 and electrically connected to the first lead electrode 31 and the second lead electrode 32, and a resin layer 40 encapsulating the light emitting device 100.

The body 20 may be formed including at least one of a silicon material, a synthetic resin material, or a metal material. Also, the body 20 may include a ceramic printed circuit board (PCB), a metal PCB, or a flexible PCB.

The body 20 may be formed with a cavity 22, that is, a recess having a predetermined depth. The body 20 may be formed without a cavity 22, but the present invention is not limited thereto. While a periphery of the cavity 22 positioned around the light emitting device 100 may be formed as an inclining surface, the present invention is not limited thereto.

The first lead electrode 31 and the second lead electrode 32 are disposed in the body 20 and are electrically separated from each other to supply an electric power to the light emitting device 100. Also, the first and second lead electrodes 31 and 32 may reflect light generated from the light emitting device 100 to thus increase light efficiency, and may emit heat generated from the light emitting device 100 to an outside thereof.

The light emitting device 100 may be mounted on the second lead electrode 32. The light emitting device 100 may be mounted on at least one of the body 20, the first lead electrode 31, or the second lead electrode 32, but the present invention is not limited thereto.

The light emitting device 100 may be electrically connected to the first lead electrode 31 and the second lead electrode 32 by any one of a bonding method using plural wires, a method using one wire and die bonding, a flip chip method, or a die bonding method without a wire, but the present invention is not limited thereto.

The resin layer 40 is disposed on the transparent electrode layer 120 of FIG. 1, and may be formed of transparent resin material, such as silicon or an epoxy having a refractive index lower than the transparent electrode layer 120. The resin layer 40 may enclose and protect the light emitting device 100. Also, a fluorescent material may be included in the resin layer to change the wavelength of light emitted from the light emitting device 100. The resin layer 40 is disposed in the cavity 22 or may be protruded in a lens shape, but the present invention is not limited thereto. A lens may be further disposed on the resin layer 40, but the present invention is not limited thereto.

In the light emitting device package 30 according to the embodiment, a transparent electrode layer is disposed on the light emitting device 100, such as a chip, and the resin layer 40 is disposed on the transparent electrode layer. The transparent electrode layer may be formed at an optimum thickness in consideration of the transmittance and reflectivity according to its thickness.

While the current embodiment shows and describes the top view type light emitting device package, the light emitting device package may be implemented by a side view type light emitting device package to provide improved effects in the heat releasing characteristic, conductivity and reflective characteristic. In the top view type or side view type light emitting device package, after the resin layer 40 is formed of a resin material, a lens may be formed or attached on the resin layer 40, but the present invention is not limited thereto.

Figure 3:
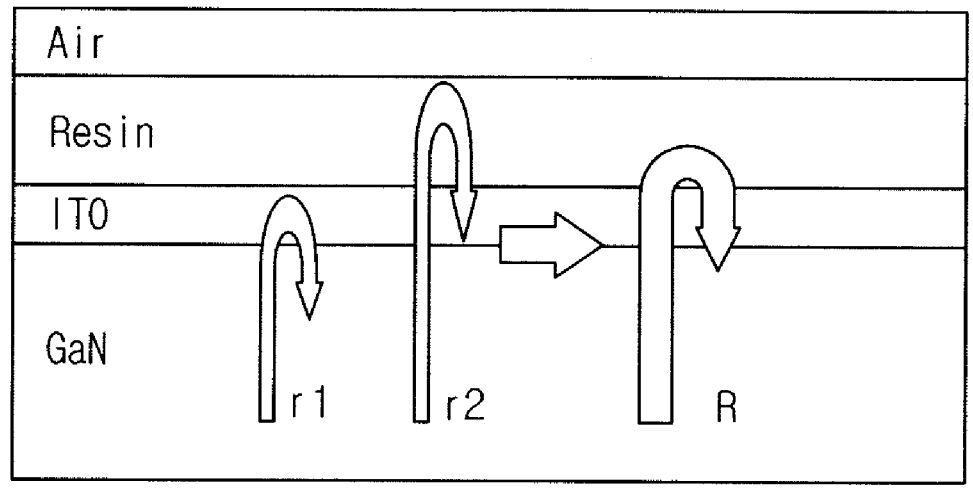
FIG. 3 is a schematic view illustrating light reflection in respective layers constituting a light emitting device.

FIG. 3 is a schematic view illustrating light reflection characteristics in a light emitting device package according to an embodiment.

Referring to FIG. 3, light is emitted to air through the GaN layer, the ITO layer, and the resin layer. The GaN layer is one example of compound semiconductor layers constituting an active layer emitting light.

The light emitted from the light emitting device, particularly, the light emitted from the active layer has a wavelength of 450 nm. The wavelength of the light emitted from the active layer may be varied within a range of 430 nm to 480 nm according to the material thereof for blue wavelength of light. Also, the growth material of the active layer may be changed according to the wavelength for red light, green light or UV light.

The refractive index of the GaN layer is 2.5, the refractive index of the ITO layer is 2.0, and the refractive index of the resin layer is 1.5. The refractive index of the semiconductor layer such as the GaN layer may have a range of 2.3 to 2.5, the refractive index of the ITO layer may have a range of 1.7 to 2.1 according to the wavelength of light, and the refractive index of the resin layer may have a range of 1.5±0.2. Hereinafter, for the convenience of description, an example when the refractive index of the GaN layer is 2.5, the refractive index of the ITO layer is 2 and the refractive index of the resin layer is 1.5 will be described.

The light is emitted to the air through the GaN layer, the ITO layer, and the resin layer. At this time, some of the light emitted from the active layer is transmitted and the other or a remainder of the light is reflected due to a difference of the refractive index in a boundary between the layers. The reflectivity (R) is determined by a reflectivity (r1) in the boundary between the GaN layer and the ITO layer and a reflectivity (r2) due to a difference of the refractive index in the boundary between the ITO layer and the resin layer.

According to Snell's law, when light passes through a boundary between two different media, although the angle of refraction is changed according to the angle of incidence, the ratio of the sines of the angles of incidence and of refraction is constant. Thus when light passes through a boundary between two different media, the ratio of the sines which is always constant is referred to as "refractive index," and is expressed by sine (angle of incidence)/sine (angle of refraction).

When light passes through two adjacent transparent media, the reflectivity (R) is obtained by using Fresnel's equation and may be varied with the refractive indices of the two transparent media. The reflectivity ($\rho = R$) may be expressed by the following equation:

$$\rho = \left(\frac{n_2 - n_1}{n_2 + n_1}\right)^2$$

The reflectivity p may be obtained from percentage of amount of the reflected light.

Herein, the reflectivity $\rho$ of light according to the thickness of the ITO layer is as follows.

The reflectivity '$\rho(\lambda)$' may be calculated by using the transfer matrix method (TTM), and may be expressed by the following equation 1. Herein, the wavelength A is in a range of 420 nm to 480 nm, the wavelength reflectivity $\lambda$DBR (distributed Bragg Reflection) is 450 nm, the refractive index N_ITO of the ITO layer is 2.00, the refractive index N_Resin of the resin is 1.5, and the refractive index N_sub of the substrate is 2.5. Also, the thickness dITO of the ITO layer is 60 nm and the thickness d Resin of the resin layer is 3000 nm. Also, in the equation 1, y0 indicates the wavelength of incident light, and θ0 indicates the angle of incidence of a medium.

$$\text{ORIGIN} = 1 \quad i := \sqrt{-1} \quad \lambda := 420, 420.1 \ldots 480 \quad \langle \text{Equation 1} \rangle$$

$$\theta 0 = \pi \cdot \frac{0}{180} \quad \lambda DBR := 450 \quad y0 := \sqrt{\frac{8.85418}{4 \cdot \pi} \cdot 10^{-5}}$$

$$\text{N\_ITO} := 2.00 \quad \text{N\_Resin} := 1.5 \quad \text{N\_sub} := 2.5$$

$$\text{d\_ITO} := 60 \quad \text{d\_Resin} := 3000$$

$$Y_s := y0 \text{N\_sub} \cdot \sqrt{1 - \left(\frac{\sin(\theta 0)}{\text{N\_sub}}\right)^2}$$

$$Y_o := y0 \cdot \sqrt{1 - \left(\frac{\sin(\theta 0)}{I}\right)^2}$$

$$YL := y0 \text{N\_Resin} \cdot \sqrt{1 - \left(\frac{\sin(\theta 0)}{\text{N\_Resin}}\right)^2}$$

$$YH := y0 \text{N\_ITO} \cdot \sqrt{1 - \left(\frac{\sin(\theta 0)}{\text{N\_ITO}}\right)^2}$$

$$\phi L(\lambda) := 2 \cdot \frac{\pi}{\lambda} \cdot \text{N\_Resin} \cdot \text{d\_Resin} \cdot \sqrt{1 - \left(\frac{\sin(\theta 0)}{\text{N\_Resin}}\right)^2}$$

$$\phi H(\lambda) := 2 \cdot \frac{\pi}{\lambda} \cdot \text{N\_ITO} \cdot \text{d\_ITO} \cdot \sqrt{1 - \left(\frac{\sin(\theta 0)}{\text{N\_ITO}}\right)^2}$$

$$M(\lambda) := \left[\frac{1}{2} \cdot \begin{pmatrix} 1 & \frac{1}{Y_s} \\ 1 & \frac{-1}{Y_s} \end{pmatrix} \cdot \begin{pmatrix} \cos(\phi H(\lambda)) & \frac{1}{YH} \cdot \sin(\phi H(\lambda)) \\ i \cdot YH \cdot \sin(\phi H(\lambda)) & \cos(\phi H(\lambda)) \end{pmatrix} \right.$$

$$\left. \cdot \begin{pmatrix} \cos(\phi L(\lambda)) & \frac{1}{YL} \cdot \sin(\phi L(\lambda)) \\ i \cdot YL \cdot \sin(\phi L(\lambda)) & \cos(\phi L(\lambda)) \end{pmatrix} \cdot \begin{pmatrix} 1 & 1 \\ Y_o & -Y_o \end{pmatrix}\right]$$

$$R(\lambda) := \left\|\frac{(M(\lambda)_{2,1})}{(M(\lambda)_{2,1})}\right\|^2$$

In Equation 1, Ys indicates a light power when light passes through a substrate, Yo indicates a light power when light passes through air, YL indicates a light power when light passes through the resin layer, YH indicates a light power when light passes through the ITO layer, $\Phi L(\lambda)$ indicates a phase variation according to the thickness of the resin layer, and $\Phi H(\lambda)$ indicates a phase variation according to a variation in the thickness of the ITO layer.

The output light flux $M(\lambda)$ of the light passing through the ITO layer, the resin layer and the air is measured by applying the respective parameters to the TMM equation. At this time, the reflectivity $R(\lambda)$ can be calculated from a ratio of output light flux $M((\lambda_{2,1})$ to input light flux $M((\lambda_{1,1})$.

Figure 4:
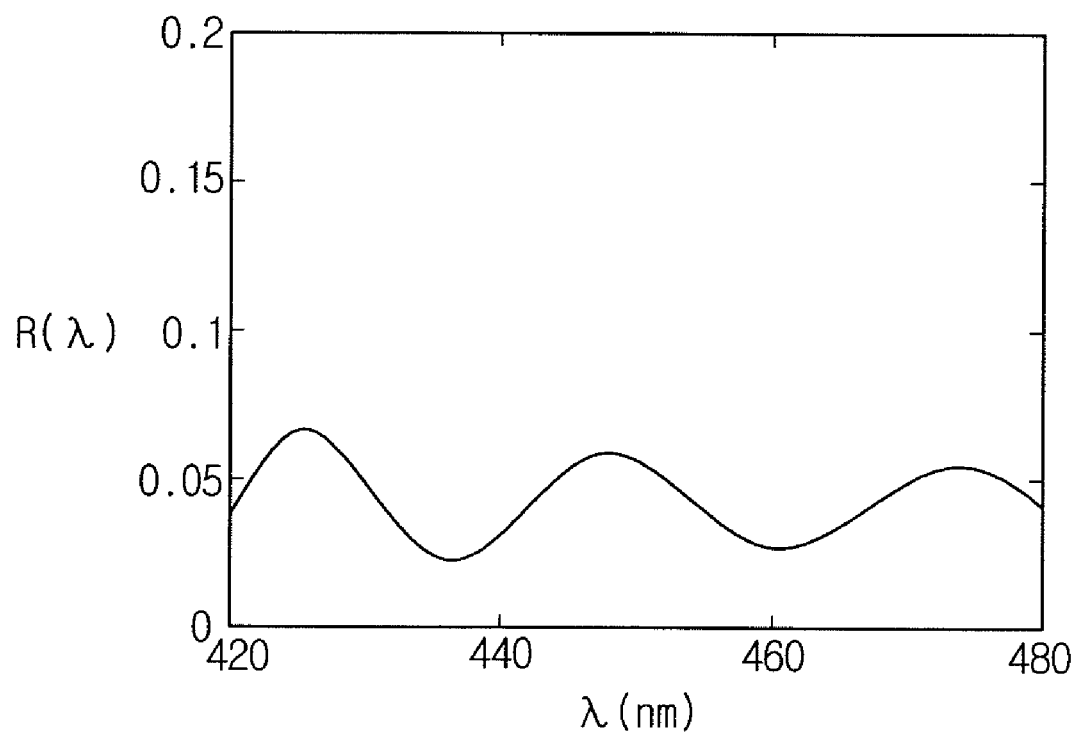
FIG. 4 is a graph showing reflectivity according to wavelengths of light when an ITO layer is 60 nm thick in an embodiment.

The reflectivity of light according to the wavelength variation (420 nm to 480 nm) can be obtained by applying corresponding wavelengths to the TMM equation, and is shown in FIG. 4. Referring to FIG. 4, it can be seen that the light reflectivity at 450 nm is 5.5%, and the light reflectivity at 430 nm and 460 nm is less than 5%.

Figure 5:
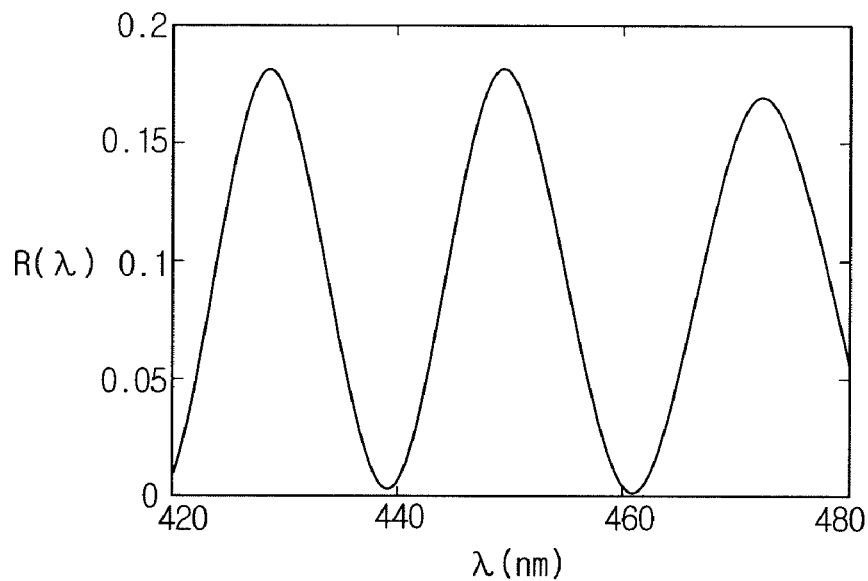
FIG. 5 is a graph showing reflectivity according to wavelengths of light when an ITO layer is 220 nm thick in an embodiment.

FIG. 5 is a graph showing the reflectivity variation when the thickness of the ITO layer is 220 nm and the wavelength of the light is varied from 420 nm to 480 nm. Referring to FIG. 5, it can be seen that the reflectivity at 450 nm is 18.1% and the reflectivity at 440 nm and 460 nm is very minimal (i.e., almost zero).

Comparing FIG. 4 with FIG. 5, in the instance where the wavelength of light is 450 nm, it can be seen that the reflectivity of light when the thickness of the ITO layer is 60 nm is less than ⅓ of the reflectivity of the light when the thickness of the ITO layer is 220 nm. Also, since the decrease in the thickness of the ITO layer is proportional to the decrease in the reflectivity, the light output efficiency can be improved.

Meanwhile, the thickness of the resin layer may be set to a certain thickness, for example, 3000 nm. Even if the resin layer is not used, since the light reflectivity at 60 nm is lower than that at 220 nm, light extraction efficiency can be improved. Herein, 1 nm is equal to 10 Å.

Figure 6:
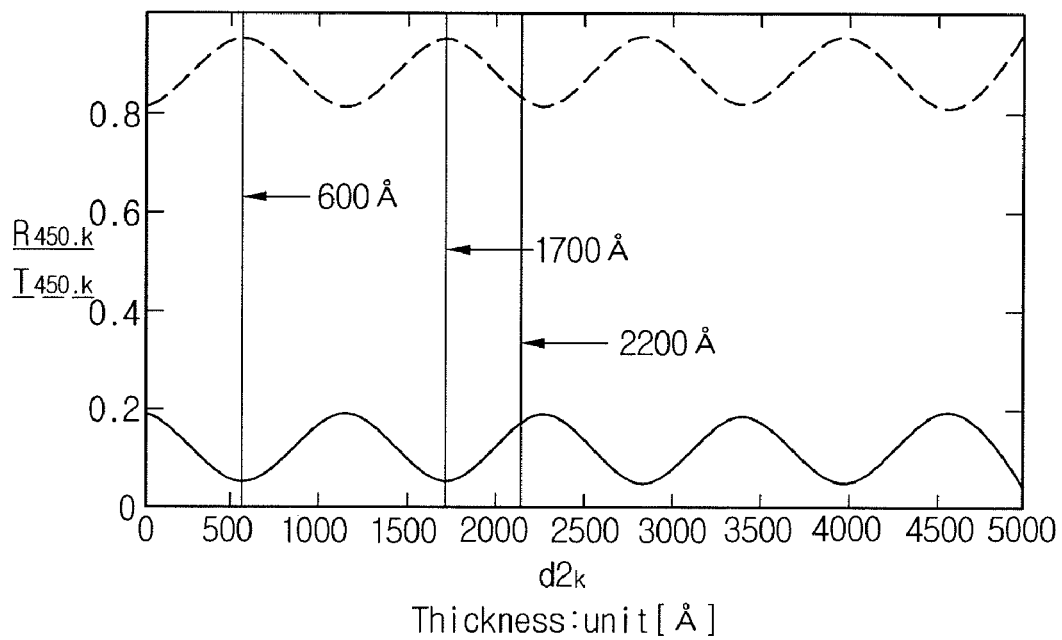
FIG. 6 is a graph comparing transmittance and reflectivity according to thicknesses of an ITO layer in an embodiment.

FIG. 6 is a graph showing the transmittance and the reflectivity when the thickness of the ITO layer is varied at the light wavelength of 450 nm.

In FIG. 6, comparing the transmittance ($T_{450}$, k) and the reflectivity ($R_{450}$, k) when the thickness of the ITO layer is T1 (600 Å), T2 (1700 Å), and T3 (2200 Å), respectively, it can be seen that the transmittance is highest and the reflectivity is lowest when the thickness of the ITO layer is T1 (600 Å) or is close to T2 (1700 Å). Therefore, when the thickness of the ITO layer is 600 Å or 1700 Å, it can be seen that the difference between the transmittance and the reflectivity is greatest and thus the light extraction efficiency is also highest.

Figure 7:
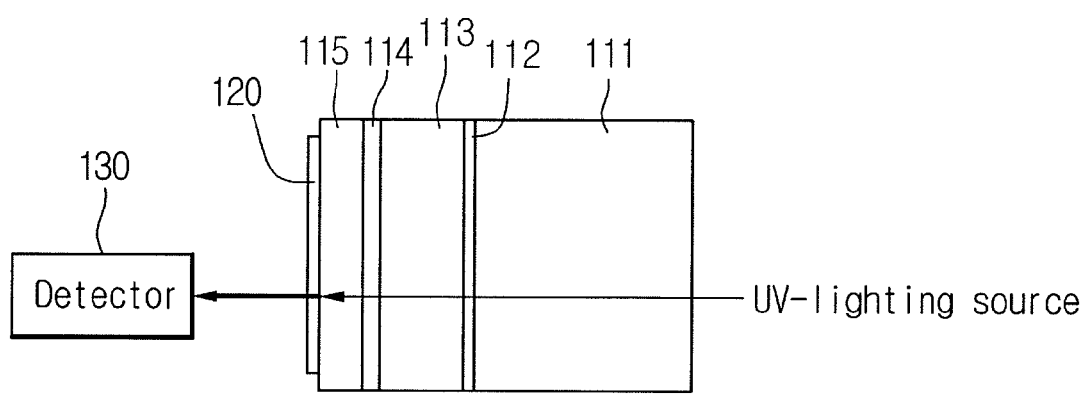
FIG. 7 is a schematic view illustrating measurement of transmittance using a UV light source according to an embodiment.
Figure 8:
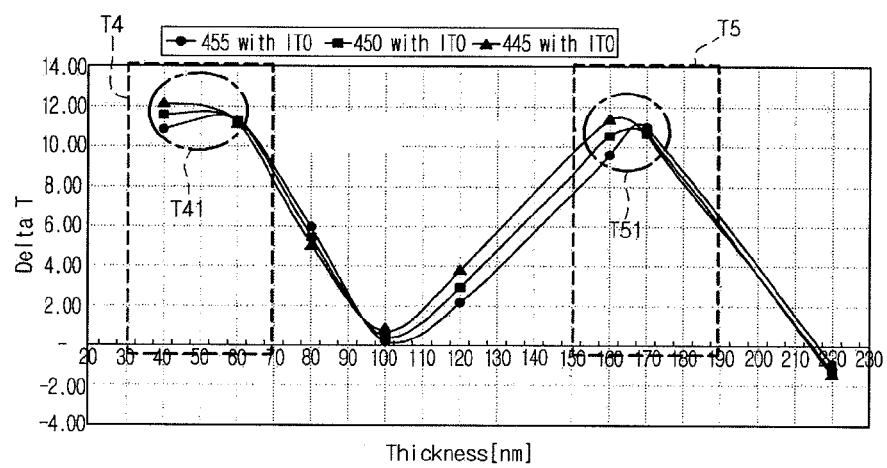
FIG. 8 is a graph showing a difference between the transmittance measured with the light emitting devices of FIG. 7 and the transmittance measured with light emitting devices of a comparative example at several wavelengths of light.

FIG. 7 is a schematic view illustrating measurement of transmittance using a UV light source according to an embodiment, and FIG. 8 is a graph showing a difference between the transmittance measured according to the thickness of an ITO layer in a light emitting device having the ITO layer.

Referring to FIG. 7, a light emitting device includes a substrate 111, a buffer layer 112, a first conductive type semiconductor layer 113, an active layer 114, a second conductive type semiconductor layer 115, and a transparent electrode layer 120. The substrate 111 is a sapphire substrate of which both surfaces are transparent, and is about 400 nm thick. A UV light source is used as the light source, and an ultraviolet (UV)-visible (VIS)-near infrared (NIR) spectrophotometer is used as a photodetector 130. Herein, the wavelength (λ) of the UV boundary is less than 390 nm (i.e., λ≦390 nm), the wavelength of the UV-visible boundary is about 390 nm to 410 nm, the wavelength of the visible boundary is about 410 nm to 780 nm, and the wavelength of near infra red is about 780 nm to 4000 nm.

The light emitting devices used for measuring transmittance may emit lights having wavelengths of about 455 nm, 450 nm, and 445 nm, respectively, and have respective ITO layers of which the thickness is varied from about 40 nm to 220 nm. The transmittance of the light emitting devices and the transmittance of comparative devices were measured to obtain a transmittance difference (Delta T) by subtracting the transmittance of comparative devices from the transmittance of the light emitting devices. The obtained transmittance difference values are shown in the graph of FIG. 8. In this measurement, the comparative devices correspond to devices prepared by removing the ITO layer from the light emitting devices shown in FIG. 7.

FIG. 8 is a graph showing the transmittance difference between the light emitting devices of FIG. 7 and the comparative devices.

Referring to FIG. 8, the transmittance difference (Delta T) is greatest when the thickness of the ITO layer is in a first thickness range T4 of about 30 nm to 70 nm and in a second thickness range T5 of about 150 nm to 190 nm. Particularly, the transmittance difference is greatest when the thickness of the ITO layer is in a range T41 of about 40 nm to 60 nm which is included in the first thickness range T4, and in a range T51 of about 160 nm to 170 nm which is included in the second thickness range T5.

FIGS. 9 to 16 are graphs showing transmittance of light according to thicknesses of an ITO layer before and after sputtering of the ITO layer (at a thickness of about 40 nm, 60 nm, 80 nm, 100 nm, 120 nm, 160 nm, 170 nm, and 220 nm). Herein, the polynomial (before sputtering) curve is obtained by using a best-fit line according to an error. The error in the thickness of the ITO layer to be described later may be set to about ±5 nm. The transmittance of light is a value of Spectral responsivity for wavelength of about 400 nm to 500 nm.

Figure 9:
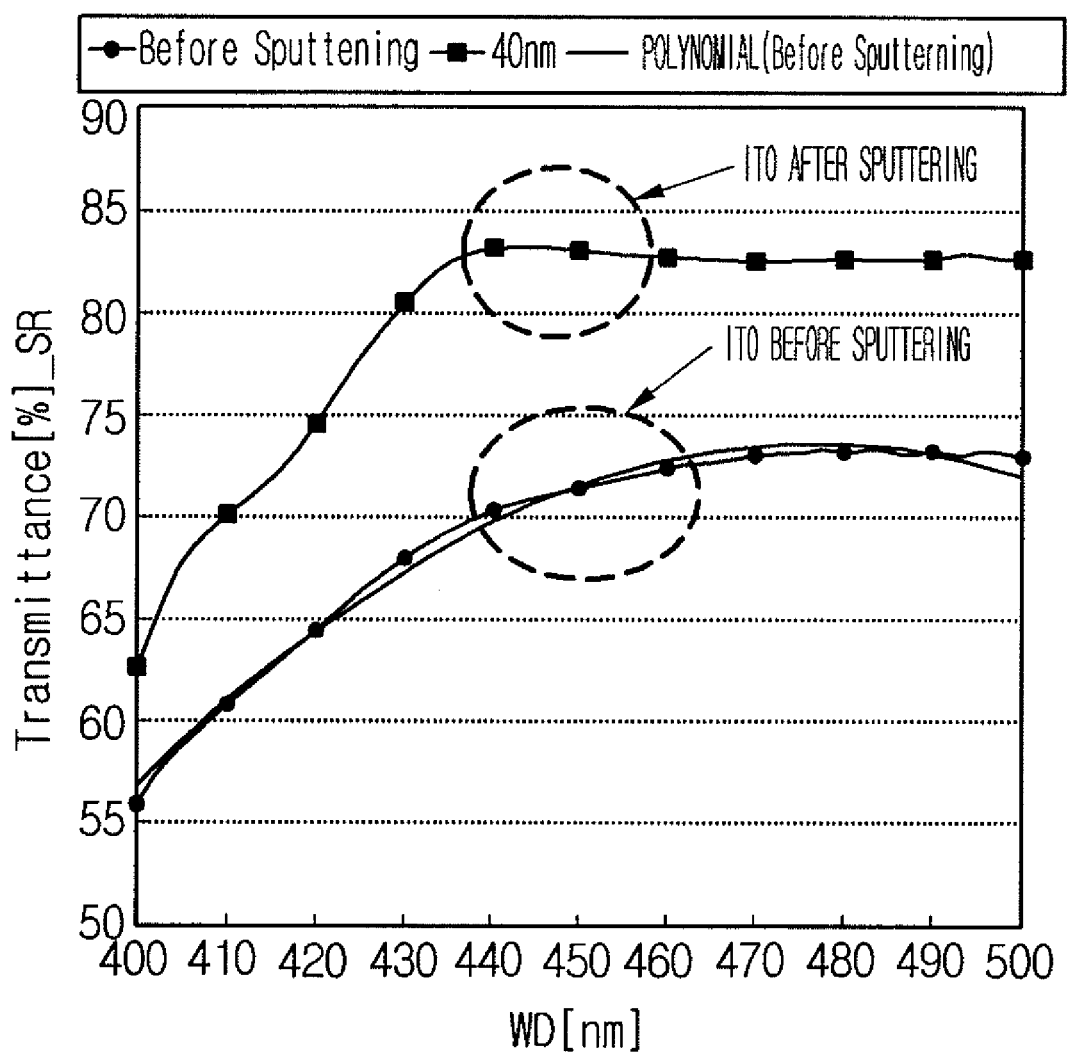
FIGS. 9 to 16 are graphs showing transmittance of light according to thicknesses of an ITO layer before and after sputtering for forming the ITO layer.

Referring to FIG. 9, the light emitting device (after sputtering of ITO layer) having an ITO layer of which the thickness is about 40 nm shows about 10% transmittance difference (a graph with square shape (■) dots), compared with the comparative device (before sputtering in a wavelength range of about 430 nm to 500 nm (a graph with circular shape (●) dots). In the light emitting devices according to the embodiment, when the thickness of the ITO layer is in a range of about 40 nm to 70 nm and the wavelength of light is in a range of about 430 nm to 500 nm (WD: wavelength dispersive), the light transmittance is about 80% or more. That is, by depositing the ITO layer in the above thickness range, the light transmittance can be improved by about 10%.

Figure 10:
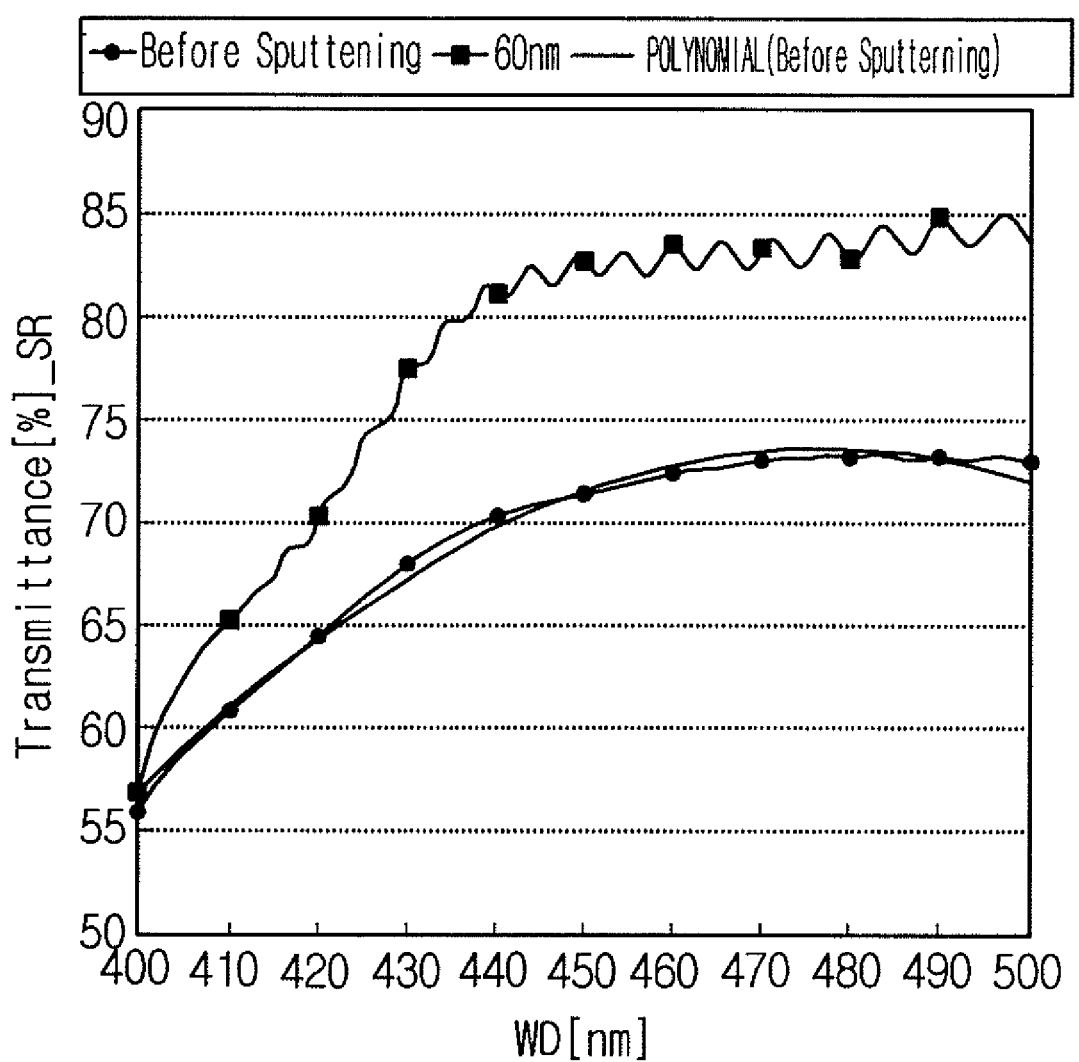

Referring to FIG. 10, when the ITO layer is about 60 nm thick and the wavelength of light is in a range of about 430 nm to 500 nm, there is about 10% transmittance difference between the light emitting devices with the ITO layer (after sputtering) and the comparative devices without the ITO layer (before sputtering). In the light emitting devices according to the embodiment, when the thickness of the ITO layer is in a range of about 40 nm to 70 nm and the wavelength of light is in a range of about 430 nm to 500 nm, the light transmittance is about 75% or more. That is, by depositing the ITO layer in the above thickness range, the light transmittance can be improved by about 10%.

Figure 11:
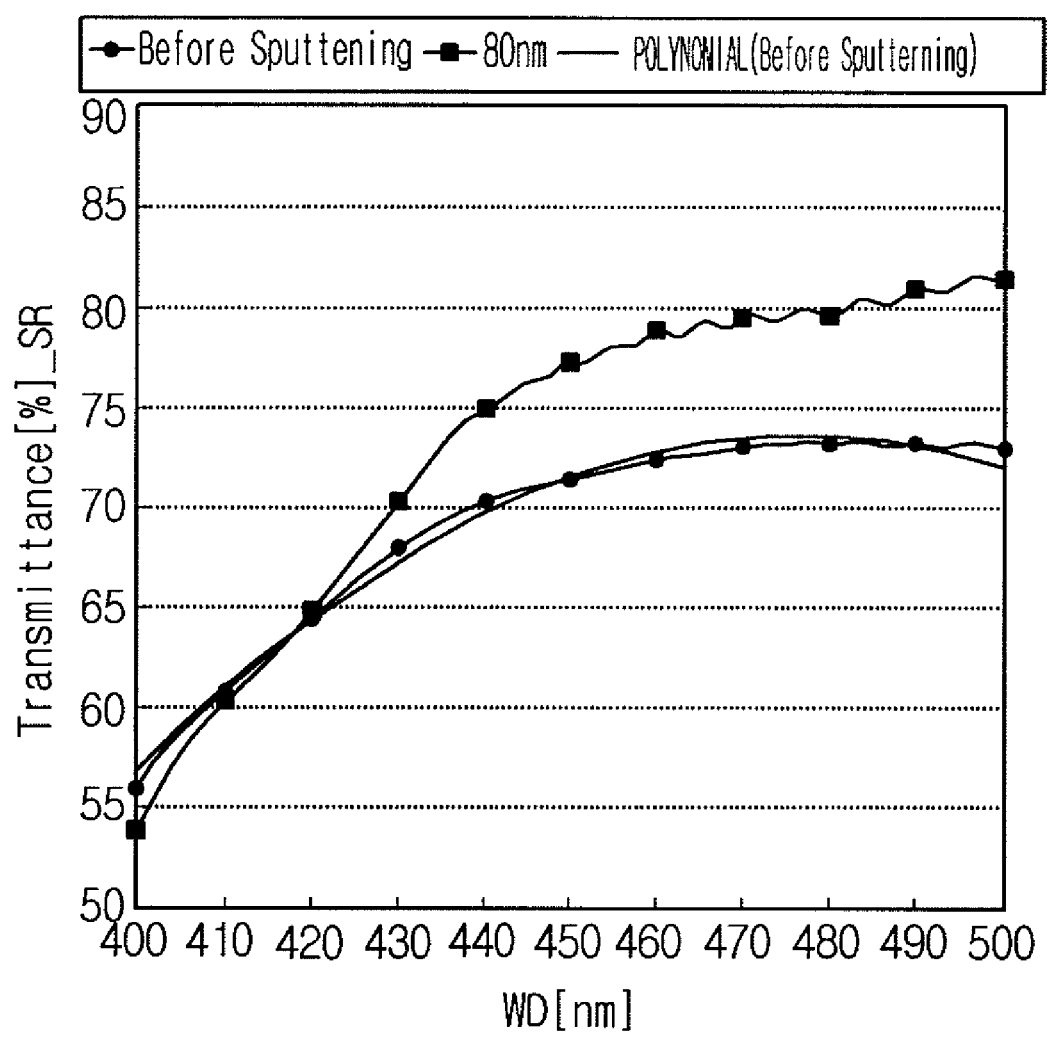

Referring to FIG. 11, when the ITO layer is about 80 nm thick and the wavelength of light is in a wavelength range equal to or more than about 440 nm, the light emitting devices with the ITO layer (after sputtering) has a transmittance of about 75% which is improved by about 5%, compared with the transmittance of the comparative devices without the ITO layer (before sputtering). That is, by depositing the ITO layer in the above thickness range, the light transmittance can be improved by about 5%.

Figure 12:
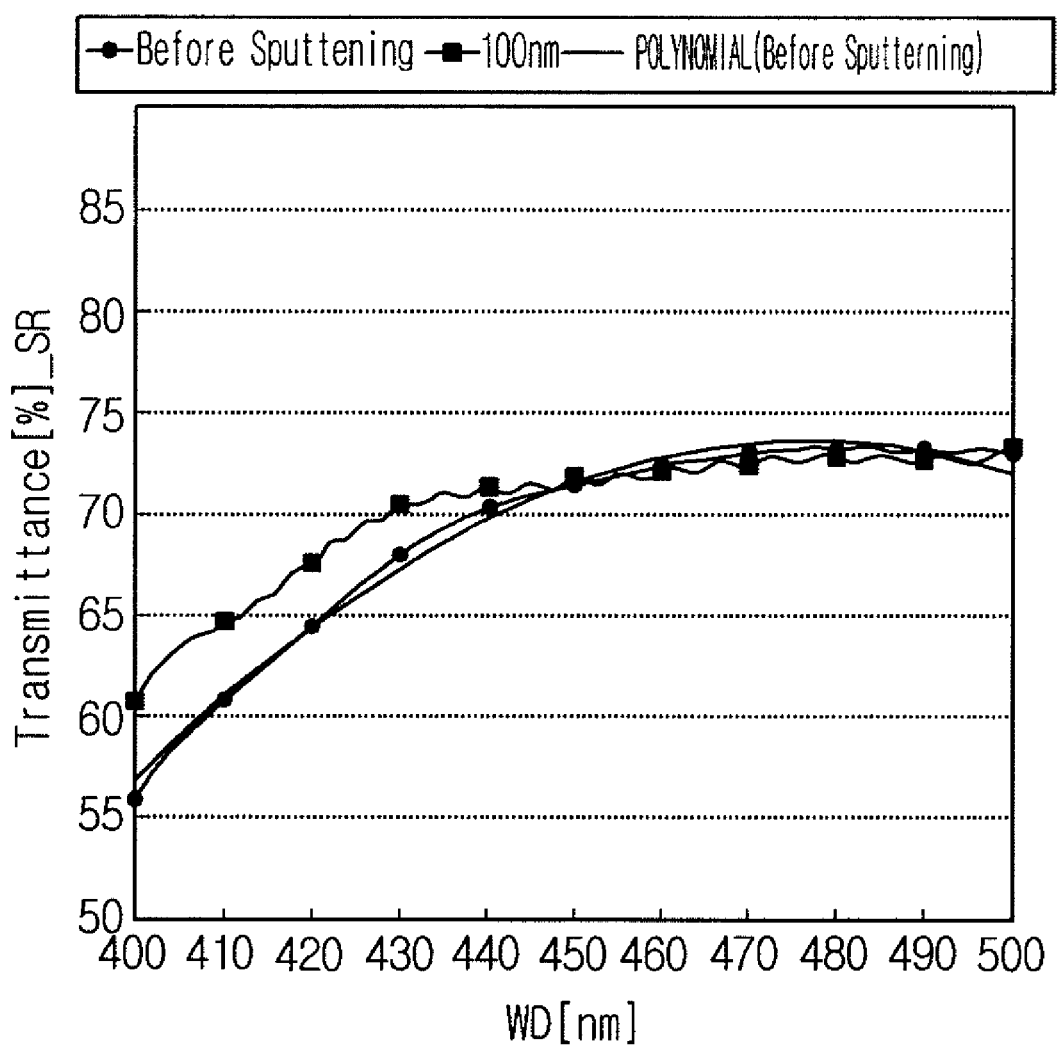
Figure 13:
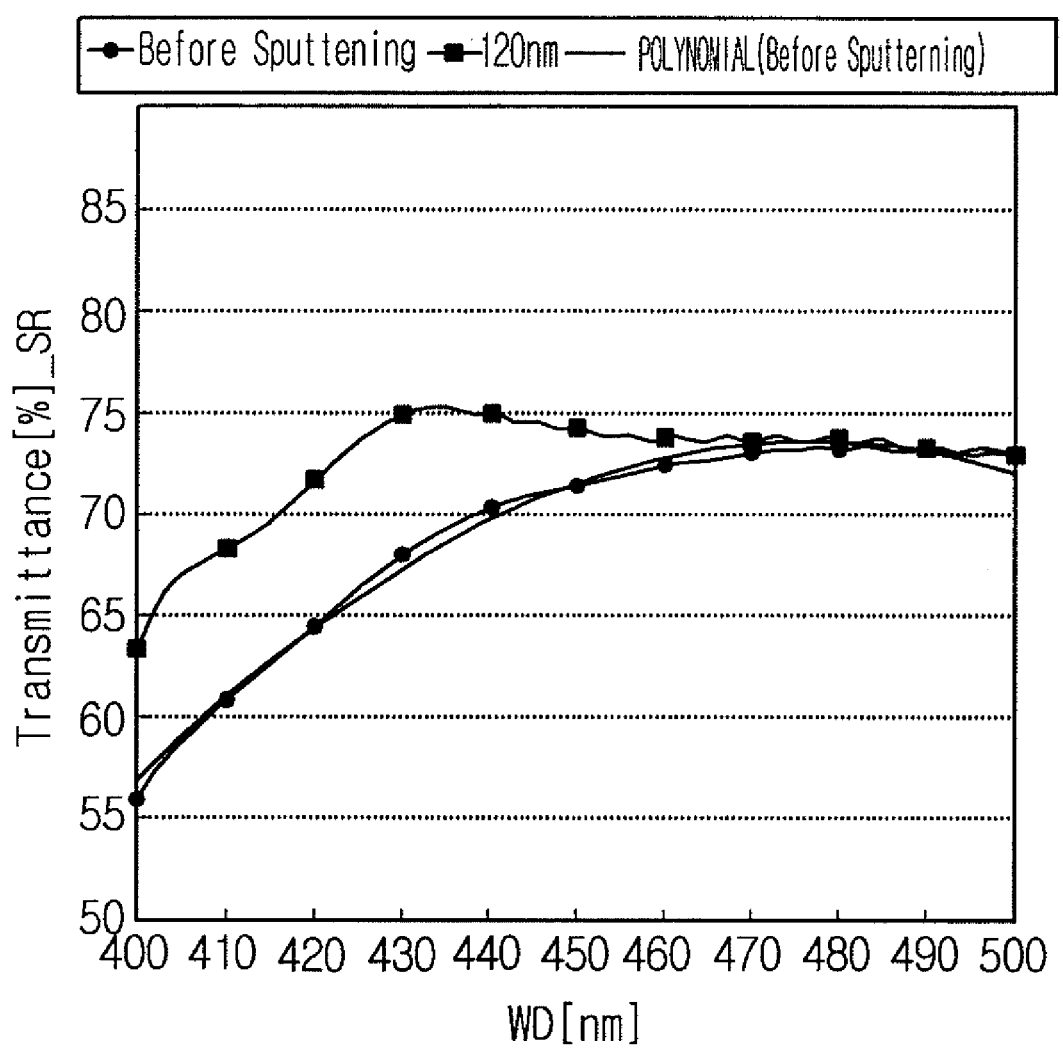

Referring to FIG. 12, when the ITO layer is about 100 nm thick, the light emitting devices with the ITO layer (after sputtering) has no difference in the transmittance from the comparative devices without the ITO layer (before sputtering). As shown in FIG. 13, when the ITO layer is about 120 nm thick and the wavelength of light is in a range which is equal to or less than about 440 nm, the light emitting devices with the ITO layer (after sputtering) show better transmittance than the light emitting devices without the ITO layer (before sputtering).

Figure 14:
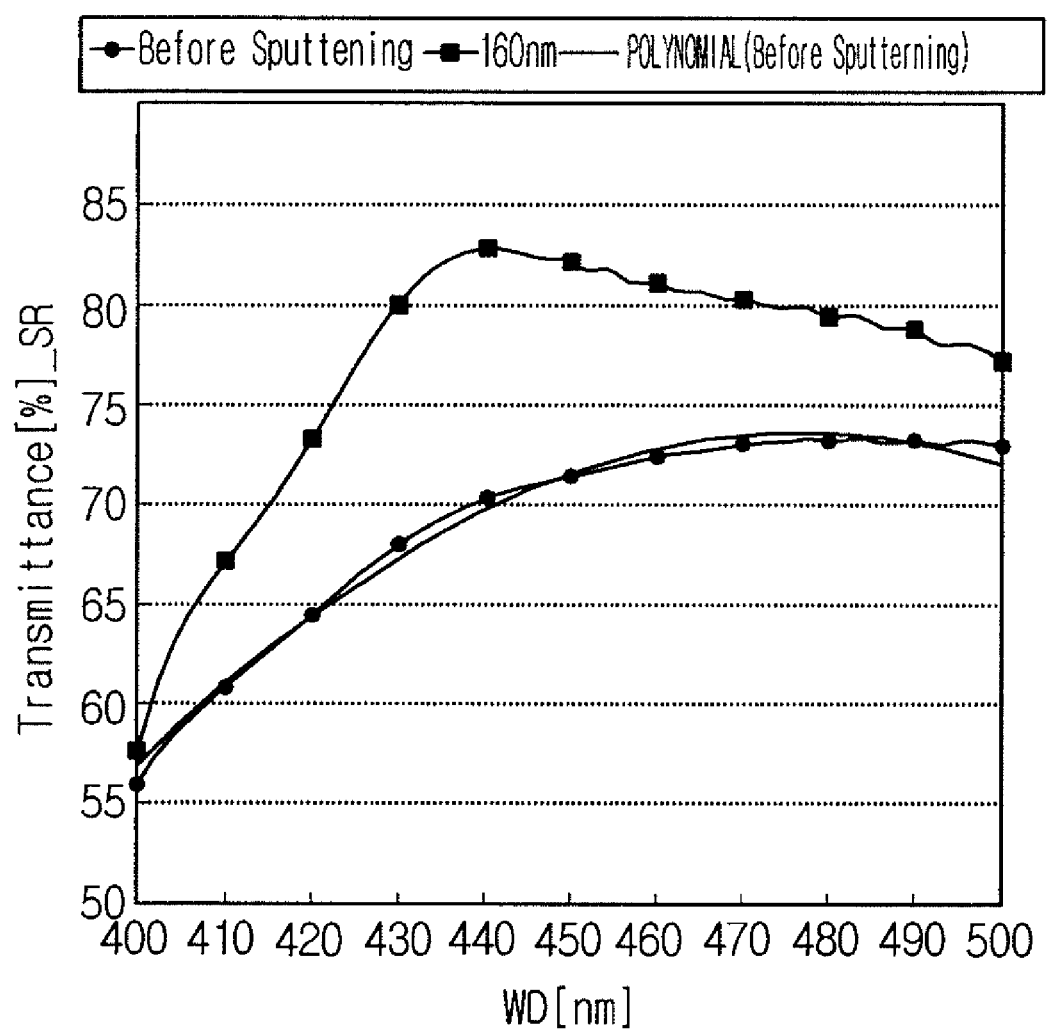

Referring to FIG. 14, when the ITO layer is about 160 nm thick and the wavelength of light is in a range of about 430 nm to 500 nm, the light emitting devices with the ITO layer (after sputtering) has a difference of about 5% to 15% in the transmittance compared with the light emitting devices without the ITO layer (before sputtering). That is, by depositing the ITO layer in the above thickness range, the light transmittance can be improved by about 5% to 15%.

Figure 15:
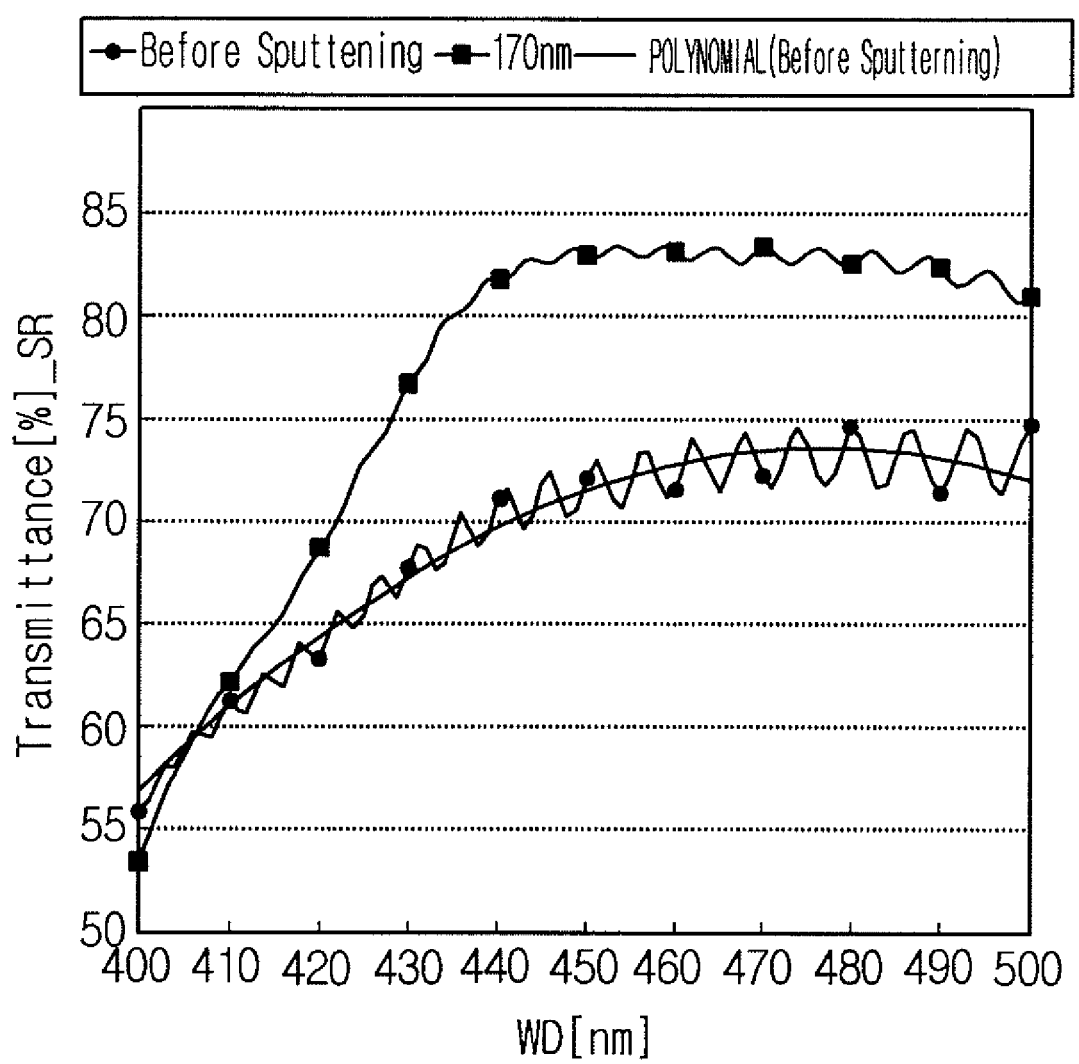

Referring to FIG. 15, when the ITO layer is about 170 nm thick and the wavelength of light is in a wavelength range of about 435 nm to 500 nm, the light emitting devices with the ITO layer (after sputtering) has a transmittance of about 80% which is improved by about 5% to 10%, compared with the transmittance of the comparative devices without the ITO layer (before sputtering). In the embodiment, by depositing the ITO layer in a thickness range of about 160 nm to 190 nm, the light emitting devices have a transmittance equal to or more than about 80% which is improved by about 5% to 10%, compared with the comparative devices without the ITO.

Figure 16:
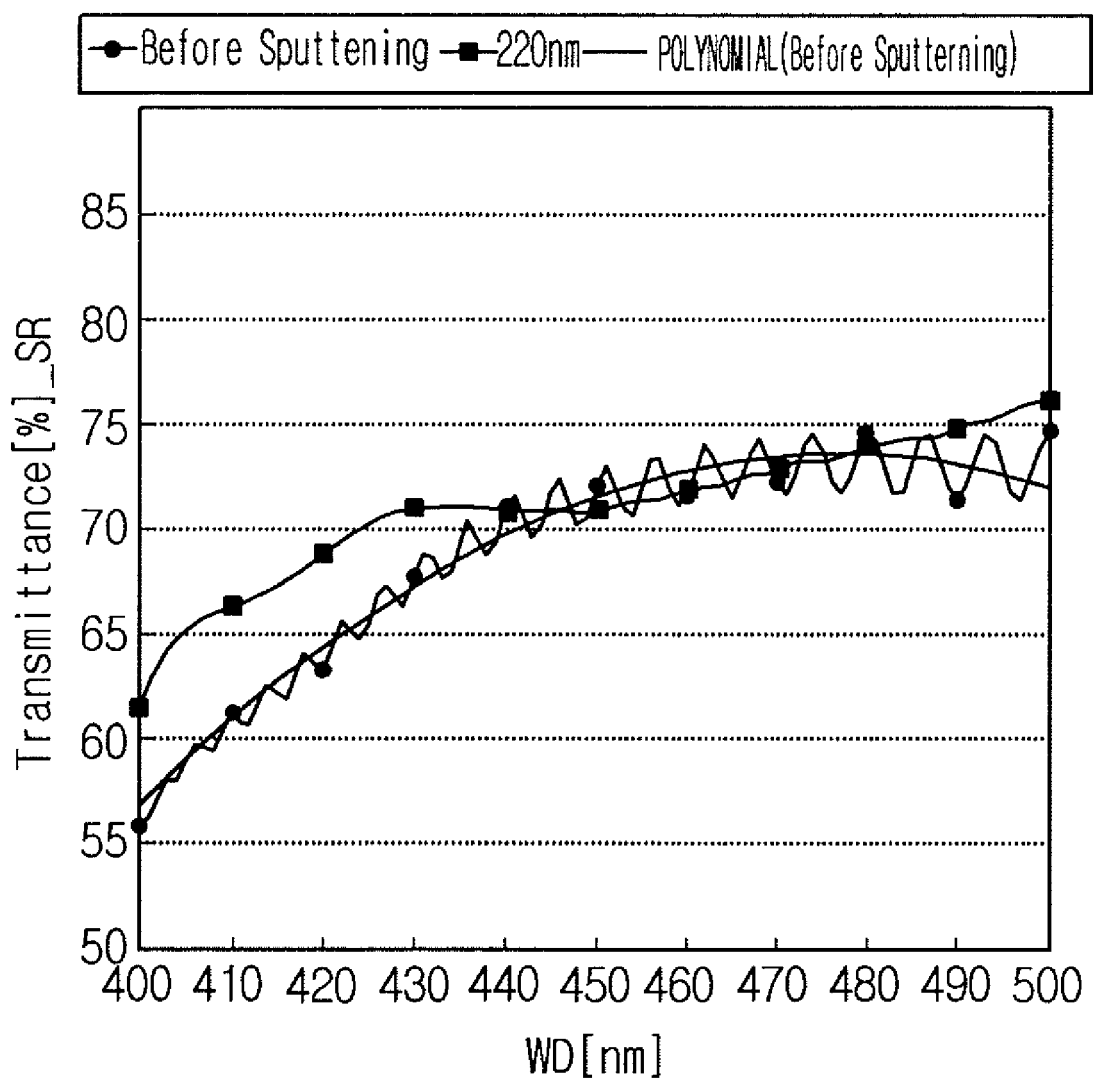

Referring to FIG. 16, when the ITO layer is about 220 nm thick and the wavelength of light is in a range of about 430 nm to 500 nm, the light emitting devices with the ITO layer (after sputtering) has almost no difference in the transmittance from the comparative devices without the ITO layer (before sputtering) (before sputtering). Regardless of whether the ITO layer is deposited at the above thickness or the ITO layer is not deposited, there is no difference in the transmittance.

Thus, in the light emitting devices according to the embodiment, the light power of when the thickness of the ITO layer is in the range of about 30 nm to 70 nm and in the range of about 160 nm to 190 nm can be improved by about 6%, compared with the light power of when the thickness of the ITO layer is, for example, about 220 nm.

Figure 17:
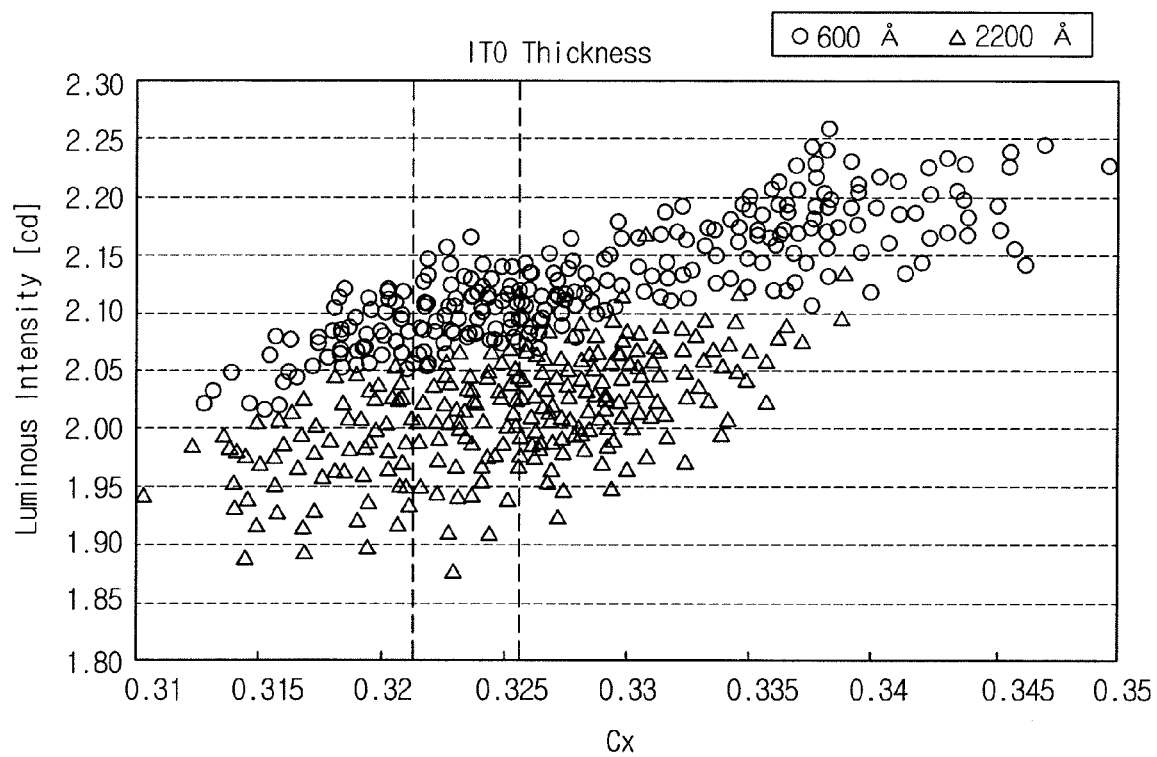
FIG. 17 is a graph comparing light distributions of light emitting devices on a CIE color coordinate when an ITO layer is 600 Å and 2000 Å thick.
Figure 18:
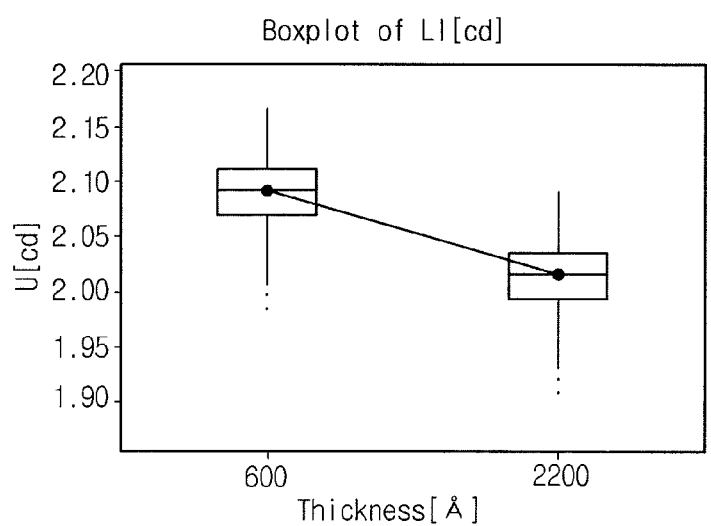
FIG. 18 is a graph of a luminous intensity and a box plot thereof depending on the thickness of the ITO layer according to an embodiment.

FIG. 17 is a graph comparing light distributions of light emitting devices on a CIE (Commission International de l'Eclairage) color coordinate when the ITO layer is about 600 Å thick and about 2200 Å thick, respectively, and FIG. 18 is a graph comparing a luminous intensity and a box plot depending on the thickness of the ITO layer according to an embodiment.

As shown in FIGS. 17 and 18, when the Ito layer is about 600 Å thick, the light distribution Cx is in a range of about 0.322 to 0.327 and the luminous intensity is in a range of about 2.0 to 2.05. Therefore, it can be seen that the light emitting device having the ITO layer of which thickness is about 600 Å has a luminous intensity improved by about 6%, compared with the light emitting device having the ITO layer of which thickness is about 1000 Å or more.

<Lighting System>

A lighting system according to an embodiment includes a light emitting module in which the light emitting device of FIG. 1 or the light emitting device package of FIG. 2 is arrayed on a board in a plurality. In the lighting system, a light unit is implemented in a side view type or a top view type, and is provided to display apparatuses for portable terminals, notebook computers, etc., or is variously applicable to lighting apparatuses, indicator apparatuses, etc.

Figure 19:
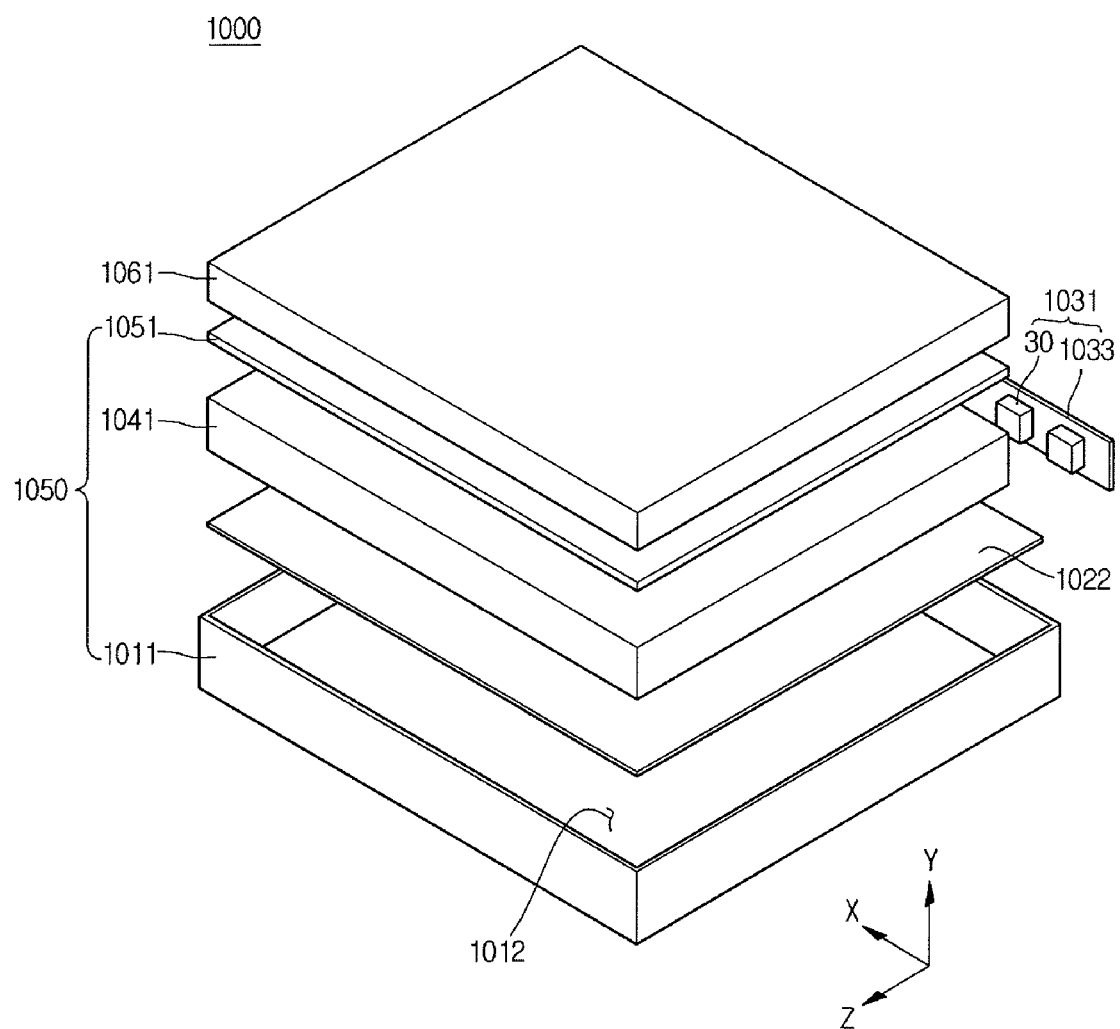
FIG. 19 is a disassembled perspective view of a display apparatus provided with the light emitting device package of FIG. 2.
Figure 20:
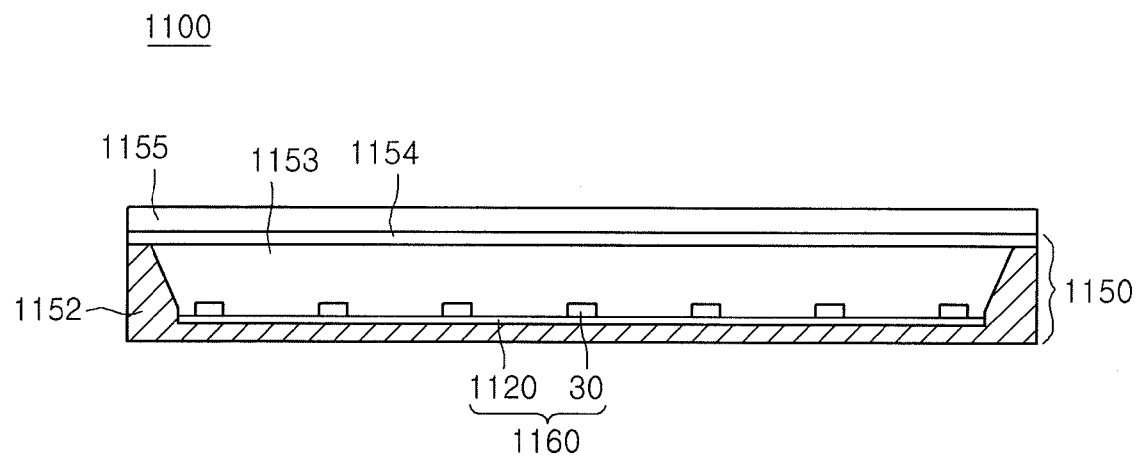
FIG. 20 is a schematic sectional view illustrating another example of a display apparatus provided with the light emitting device package of FIG. 2.
Figure 21:
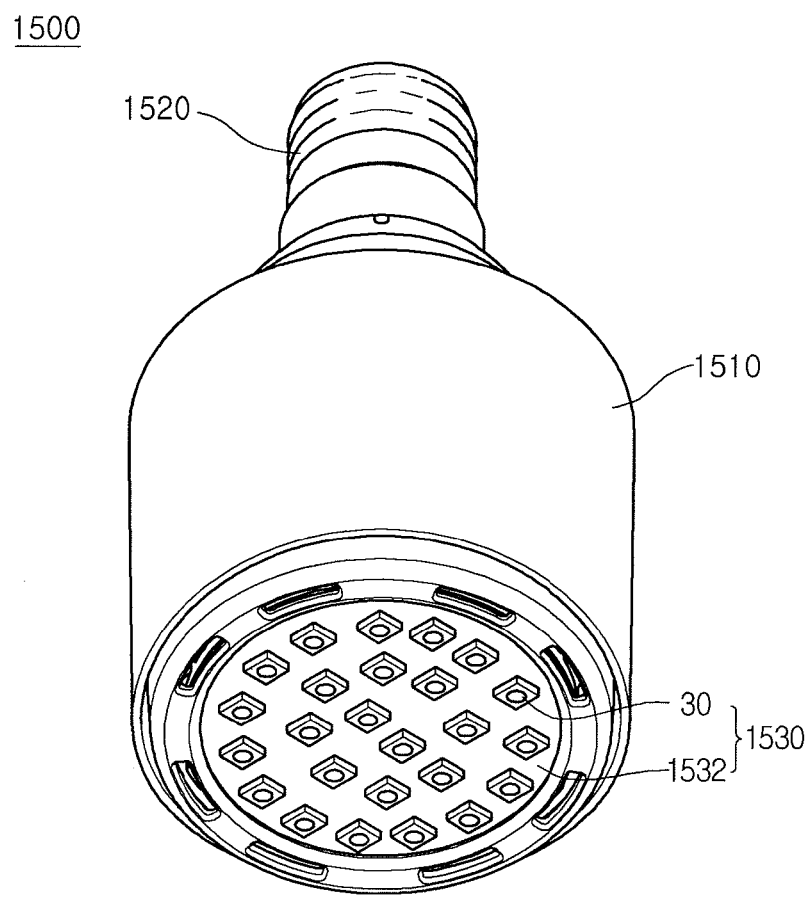
FIG. 21 is a perspective view of a lighting apparatus provided with the light emitting device package of FIG. 2.

The lighting system may include a display apparatus shown in FIGS. 19 and 20, a light unit shown in FIG. 21, in addition to a lighting lamp, a signal light, a vehicle headlight, an electronic display, etc.

FIG. 19 is a disassembled perspective view of a display apparatus according to an embodiment.

Referring to FIG. 19, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present invention is not limited thereto.

The bottom cover 1011, the reflective sheet 1022, the light guide panel 1041, and the optical sheet 1051 may be defined as a light unit 1050.

The light guide panel 1041 functions to transform linear light to planar light by diffusing the linear light. The light guide panel 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide panel 1041, and ultimately acts as a light source of a display apparatus 1000.

The light emitting module 1031 may include at least one light emitting module 1031, and provide light directly or indirectly from one side surface of the light guide panel 1041. The light emitting module 1031 may include a board 1033, and a light emitting device package 30 according to embodiments disclosed above, and the light emitting device packages 30 may be arrayed apart by a predetermined interval from each other on the board 1033.

The board 1033 may be a printed circuit board (PCB) including a circuit pattern. The board 1033 may include a metal core PCB (MCPCB), a flexible PCB (FPCB), etc. as well as the general PCB, but the present invention is not limited thereto. In the instance where the light emitting device package 30 is mounted on a side surface or a heat releasing plate, the board 1033 may be removed. Herein, some of the heat releasing plate may contact an upper surface of the bottom cover 1011.

The plurality of light emitting device packages 30 may be mounted on the board 1033 such that light emitting surfaces of the plurality of light emitting device packages 30 are spaced apart by a predetermined distance from the light guide panel 1041, but the present invention is not limited thereto. The light emitting device package 30 may supply light to a light incident part that is one side surface of the light guide panel 1041, directly or indirectly, but the present invention is not limited thereto.

The reflective member 1022 may be provided under the light guide panel 1041. The reflective member 1022 reflects light incident from a lower surface of the light guide panel 1041 to allow the reflected light to be directed toward an upper direction, thereby being capable of enhancing brightness of the light unit 1050. The reflective member 1022 may be formed of, for example, PET, PC, PVC resin, or the like, but the present invention is not limited thereto.

The bottom cover 1011 may receive the light guide panel 1041, the light emitting module 1031, the reflective member 1022, and the like. For this purpose, the bottom cover 1011 may have a receiving part 1012 formed in a box shape, a top surface of which is opened, but the present invention is not limited thereto. The bottom cover 1011 may be coupled to a top cover, but the present invention is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present invention is not limited thereto.

The display panel 1061 is, for example, an LCD panel, and includes first and second transparent substrates facing each other, and a liquid crystal layer interposed between the first and second substrates. A polarizing plate may be attached over at least one surface of the display panel 1061, but the present invention is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing light. Also, a protective sheet may be disposed on the display panel 1061, but the present invention is not limited thereto.

Herein, the display apparatus 1000 may include the light guide panel 1041 and the optical sheet 1051 as optical members positioned on a light path of the light emitting module 1031, but the present invention is not limited thereto.

FIG. 20 is a cross-sectional view of a display apparatus according to an embodiment.

Referring to FIG. 20, the display apparatus 1100 includes a bottom cover 1152, a board 1120 on which the light emitting device packages 30 disclosed above are arrayed, an optical member 1154, and a display panel 1155.

The board 1120 and the light emitting device package 30 may be defined as a light emitting module 1060. The bottom cover 1152, the at least one light emitting module 1060, and the optical member 1154 may be defined as a light unit.

The bottom cover 1152 may be provided with a receiving part, but the present invention is not limited thereto.

Herein, the optical member 1154 may include at least one of a lens, a light guide panel, a diffusion sheet, a horizontal and vertical prism sheet, and a brightness reinforcing sheet. The light guide panel may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing light.

The optical member 1154 is disposed on the light emitting module 1060. The optical member 1154 transforms light emitted from the light emitting module 1060 to planar light, and performs diffusion, light focusing, and the like.

FIG. 21 is a perspective view of a lighting unit according to an embodiment.

Referring to FIG. 21, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 30 according to the embodiments mounted on the board 1532. The light emitting device package 30 may include a plurality of light emitting device packages which are arrayed apart by a predetermined distance from one another in a matrix configuration.

The board 1532 may be an insulator substrate on which a circuit pattern is printed, and may include, for example, a general printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 30 may be mounted on the board 1532. Each of the light emitting device packages 30 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed on and coupled to an external power as a socket type outlet, but the present invention is not limited thereto. For example, the connection terminal 1520 may be made as a pin type outlet and inserted into an external power source, or may be connected to the external power source through a power line.

The light emitting module of the light unit includes the light emitting device packages 30. The light emitting device package 30 may have a package structure using a body, or may be prepared by mounting the light emitting devices disclosed above on the board 1532 and then packaging the light emitting devices using the resin layer.

According to the embodiments, the reflectivity of the transparent electrode layer can be decreased and the transmittance of the transparent electrode layer can be improved.

Also, the light extraction efficiency of the light emitting device can be improved.

Additionally, the reliability of the semiconductor light emitting device and the light emitting device package can be improved.

The characteristics, structures, effects, etc. described in the foregoing embodiments are included in at least one embodiment of the present invention, but are not necessarily limited only to one embodiment. Further, the characteristics, structures, effects, etc., described in each of the foregoing embodiments may be embodied through combinations or modifications in form with respect to other embodiments by those skilled in the art. Therefore, contents regarding the combinations and modifications will be construed as being included within the scope of the present invention.

Any reference in this specification to 'one embodiment,' 'an embodiment,' 'example embodiment,' etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this invention. More particularly, various variations and modifications are possible in the component parts and/or arrangements of the subject combination arrangement within the scope of the invention, the drawings and the appended claims.

In addition to variations and modifications in the component parts and/or arrangements, alternative uses will also be apparent to those skilled in the art.

What is claimed is:

1. A light emitting device, comprising:
a light emitting structure including a first conductive type semiconductor layer, an active layer on the first conductive type semiconductor layer, and a second conductive type semiconductor layer on the active layer; and
a transparent electrode layer formed at least one of on and under the light emitting structure,
wherein the transparent electrode layer has a thickness in a range of 30 nm to 70 nm, the transparent electrode layer having a transmittance equal to or greater than 70% with respect to a wavelength range of light of 420 nm to 510 nm,
wherein the transparent electrode layer has a reflectivity in a range of 5% to 10% with respect to a wavelength range of light of 430 nm to 500 nm, and
wherein the transparent electrode layer comprises at least one of ITO Nitride (ITON) and IZO Nitride (IZON).

2. The light emitting device of claim 1, wherein the transparent electrode layer has a refractive index equal to or less than about 2.1.

3. The light emitting device of claim 1, wherein the transparent electrode layer comprises a metal oxide-based conductive material.

4. The light emitting device of claim 1, wherein the transparent electrode layer is disposed on the second conductive type semiconductor layer, and the light emitting device further comprises:
a first electrode electrically connected to the first conductive type semiconductor layer; and
a second electrode physically connected to the transparent electrode layer and the second conductive type semiconductor layer.

5. The light emitting device of claim 1, wherein the transparent electrode layer has a thickness in a range of 40 nm to 50 nm, and a transmittance equal to or greater than 80% with respect to a wavelength range of light of 430 nm to 500 nm.

6. The light emitting device of claim 2, wherein the transparent electrode layer has a thickness in a range of 55 nm to 65 nm, and a transmittance equal to or greater than 80% with respect to a wavelength range of light of 440 nm to 480 nm.

7. The light emitting device of claim 1, wherein the transparent electrode layer comprises a transparent material having a refractive index range of 1.7 to 2.1.

8. The light emitting device of claim 1, wherein the transparent electrode layer is formed on 50% or more of an area of a lower surface of the first conductive type semiconductor layer or of an upper surface of the second conductive type semiconductor layer.

9. The light emitting device of claim 1, further comprising:
a semiconductor layer including one of a Group II-VI compound and a group III-V compound under the first conductive type semiconductor layer; and
a substrate under the semiconductor layer.

10. A light emitting device package, comprising:
the light emitting device of claim 1;
a first electrode electrically connected to the first conductive type semiconductor layer;
a second electrode electrically connected to the second conductive type semiconductor layer;
a plurality of lead electrodes electrically connected to the first electrode and the second electrode, respectively; and
a resin layer on the light emitting device.

11. The light emitting device package of claim 10, wherein a refractive index of the transparent electrode layer is less than a refractive index of the light emitting structure, and a refractive index of the resin layer is equal to or less than the refractive index of the transparent electrode layer.

12. The light emitting device package of claim 10, wherein the resin layer has a refractive index in a range of 1.3 to 1.7.

13. The light emitting device package of claim 10, wherein the resin layer comprises silicon or an epoxy, and has a thickness of at least 3000 nm.

14. The light emitting device of claim 1, wherein the transparent electrode layer comprises a metal nitride-based conductive material.

15. A light emitting device, comprising:
a light emitting structure including a first conductive type semiconductor layer, an active layer on the first conductive type semiconductor layer, and a second conductive type semiconductor layer on the active layer; and
a transparent electrode layer formed at least one of on and under the light emitting structure,
wherein the transparent electrode layer has a thickness of in a range of 150 nm to 190 nm,
wherein the transparent electrode layer includes a transparent metal-nitride based material,
wherein the transparent electrode layer has a reflectivity in a range of 5% to 10% with respect to a wavelength range of light of 430 nm to 500 nm, and
wherein the transparent electrode layer comprises at least one of ITO Nitride (ITON) and IZO Nitride (IZON).

16. The light emitting device of claim 15, wherein the transparent electrode layer has a refractive index equal to or less than 2.1.

17. The light emitting device of claim 15, wherein the transparent electrode layer has a thickness in a range of 165 nm to 175 nm, and a transmittance equal to or greater than 80% with respect to a wavelength range of light of 435 nm to 500 nm.

18. The light emitting device of claim 15, wherein the transparent electrode layer is disposed on the second conductive type semiconductor layer and a surface of the second conductive type semiconductor layer includes a roughness.

19. The light emitting device of claim 15, wherein the transparent electrode layer is formed on 50% or more of an area of a lower surface of the first conductive type semiconductor layer or of an upper surface of the second conductive type semiconductor layer.

* * * * *